United States Patent [19]

Okada et al.

[11] 4,432,097
[45] Feb. 14, 1984

[54] TONE CONTROL CIRCUIT

[75] Inventors: Takashi Okada; Hajime Nakajima, both of Yokohama, Japan

[73] Assignee: Sony Corporation, Tokyo, Japan

[21] Appl. No.: 296,411

[22] PCT Filed: Dec. 25, 1980

[86] PCT No.: PCT/JP80/00328

§ 371 Date: Aug. 24, 1981

§ 102(e) Date: Aug. 24, 1981

[87] PCT Pub. No.: WO81/01922

PCT Pub. Date: Jul. 9, 1981

[30] Foreign Application Priority Data

Dec. 29, 1979 [JP] Japan ................................. 54-170791

[51] Int. Cl.³ ............................................. H03G 5/14
[52] U.S. Cl. ...................................................... 381/98
[58] Field of Search .................... 179/1 D; 333/28 T; 381/98, 101, 102, 103

[56] References Cited

U.S. PATENT DOCUMENTS

| | | | |
|---|---|---|---|
| 3,646,270 | 2/1972 | Shiga et al. ........................ | 179/1 D |
| 3,908,172 | 9/1975 | Aschermann et al. ....... | 333/28 T X |
| 4,055,818 | 10/1977 | Gay ................................. | 179/1 D X |
| 4,223,181 | 9/1980 | Simeau ............................. | 179/1 D |
| 4,289,928 | 9/1981 | Takaoka et al. .................... | 179/1 D |
| 4,290,335 | 9/1981 | Sondermeyer ..................... | 381/98 X |
| 4,320,534 | 3/1982 | Sakai et al. ........................ | 179/1 D X |
| 4,347,404 | 8/1982 | Kawasaki ......................... | 179/1 D X |

FOREIGN PATENT DOCUMENTS 50-33958 3/1976 Japan .
1215566 12/1970 United Kingdom .

Primary Examiner—A. D. Pellinen
Assistant Examiner—Keith E. George
Attorney, Agent, or Firm—Hill, Van Santen, Steadman & Simpson

[57] ABSTRACT

A tone control circuit which has a first signal path which passes an input signal directly and a second signal path which includes at least a filter and a gain control circuit and an adder receiving the first signal and the second signal and control means for providing a control voltage to the gain control circuit and switching means for controlling the gain control circuit to selectively control the output of the adder to produce an output signal with the desired selected frequency response.

6 Claims, 8 Drawing Figures

TONE CONTROL CIRCUIT

TECHNICAL FIELD

This invention relates to a tone control circuit, which is provided with a filter circuit supplied with an audio signal, a gain control circuit supplied with the output from the filter circuit and an operational circuit adding the input audio signal and the output from the gain control circuit with each other to carry out tone control due to the characteristic of the filter circuit and the gain of the gain control circuit and to primarily control the gain with a DC voltage which is suitable for remote control.

BACKGROUND ART

At present, the television broadcast of a voice-multiple system is practised and the quality of voice or sound in the television broadcast is remarkably improved. In association therewith, it is required that the sound field thereof are be improved. Further, in view of remote control operation of a television receiver, it is also desired that the tone control can be remotely controlled with a DC voltage. Moreover, when the circuitry of the television receiver is made as an integrated circuit, be it is necessary that the tone control circuit constructed as an integrated circuit.

In consideration of the above points, the inventors have already proposed a tone control circuit which is different from the prior art attenuation type CR system and the feedback NF system.

FIG. 1 shows the above proposed tone control circuit in which an input signal from an input terminal 10 is supplied to an adder 20. The input signal from the input terminal 10 is also fed to a boost signal line consisting of a filter 31, an amplifier 32 and a gain control circuit 33 and the output signal therefrom is fed to an add input of the adder 20. The input signal from the input terminal 10 is supplied further to a cut signal line consisting of a filter 41, an amplifier 42 and a gain control circuit 43 and the output signal therefrom is supplied to a subtract input of the adder 20. At the adder 20, the signal transmitted through the boost signal line is added to the input signal and the signal transmitted through the cut signal line is subtracted from the input signal. Thus, an output signal is derived from the adder 20 and is supplied to an output terminal 60. A voltage $V_C$ derived from a volume control 50 is applied to the gain control circuits 33 and 43 as the gain control signals.

With the above circuit, if the filters 31 and 41 are each made or used as a high pass filter, the boost and cut in a high frequency band are obtained, while if the filters 31 and 41 are each made as a low pass filter, the boost and cut in a low frequency band are obtained.

That is, when the control voltage $V_C$ is in the range from a center value $V_O$ to zero, the gain control circuit 33 is set such that its gain is zero. On the contrary, the gain control circuit 43 is so set that when the control voltage $V_C$ is in the range from the center value $V_O$ to the maximum value $2V_O$, its gain becomes zero. Accordingly, when the control voltage $V_C$ is at the center value $V_O$, the output signals from the gain control circuits 33 and 43 are both zero. Thus, at the output terminal 60 the input signal unchanged will be obtained unchanged and, the frequency characteristic at this time will be flat.

When the control voltage $V_C$ is changed from the center value $V_O$ to the maximum value $2V_O$, it is set so that the gain of the gain control circuit 33 increases and becomes 1 at the maximum value $2V_O$. Accordingly, at this state, if the gain of the amplifier 32 is taken as $A_1$, as shown in FIG. 2 the gain of the boost signal line becomes $A_1$. Therefore, the boost becomes a high boost of $A_1+1$ where of course $A_1>0$.

On the contrary, when the control voltage $V_C$ is changed from the center value $V_O$ to zero, it is set so that the gain of the gain control circuit 43 increases and becomes 1 at zero. Accordingly, at this state, if the gain of the amplifier 42 is taken as $A_2$, as shown in FIG. 3 the gain of the cut signal line becomes $A_2$. Therefore, the cut becomes a high cut of $1-A_2$ where $0 \leq A_2 \leq 1$. Thus, if $A_2=1$, the attenuation can be made infinitive.

As to the boost and cut in the low frequency band, if the filters 31 and 41 are each made as a low pass filter, the operation of the circuit becomes entirely similar to that described above.

According to the above circuit, since the control curves can be freely set both in the boost and cut directions, the characteristic which is preferable for acoustic response can be easily obtained. Further, since the control 50 has no relation to the constants of the filters 31 and 41 and is controlled by the control voltage $V_C$, the circuit is suitable to be remotely controlled.

For simplifying the circuit, it may be desired as shown in FIG. 4 that the filter 31 be used in common to both of the boost and cut lines. When the circuit is made as an integrated circuit, if only one filter 31 is used the number of pins for capacitors to be externally connected is reduced by one and hence the cost of the circuit can be substantially decreased.

However, if the filter is used in common in the cut and boost lines, the boosting frequency and cutting-off frequency do not coincide on the abscissa of frequency f as shown in FIG. 5, because the boost gain and the cut gain are different as described above. This is not desirable for auditory response.

Accordingly, this invention has an object to provide a tone control circuit which can be controlled by a DC voltage, and which is suitable to be formed as an integrated circuit and which has cut-off frequencies which are coincident with each other between the boost and cut modes.

DISCLOSURE OF INVENTION

This invention has a fundamental structure in which a filter is commonly used in both boost and cut modes and the signal passed through the filter and a gain control circuit and an input signal are calculated, and in which it is discriminated based on the control voltage for the gain control circuit whether the boost mode or cut mode is used and the filter, gain control circuit or amplifier is changed over in response to the discriminated output. Since in this invention the control is carried out by the DC voltage, this invention is suitable for remote control. Further, since the filter is used commonly, the circuit construction can be simplified and the number of pins for external connection can be fewer when the circuit is made as an integrated circuit, the control curve can be freely set and the cut-off frequency will not deviate between the boost and cut lines.

BEST MODE FOR CARRYING OUT THE INVENTION

In order to explain this invention in more detail, this will be explained with reference to FIGS. 6, 7 and 8.

Figure 1:
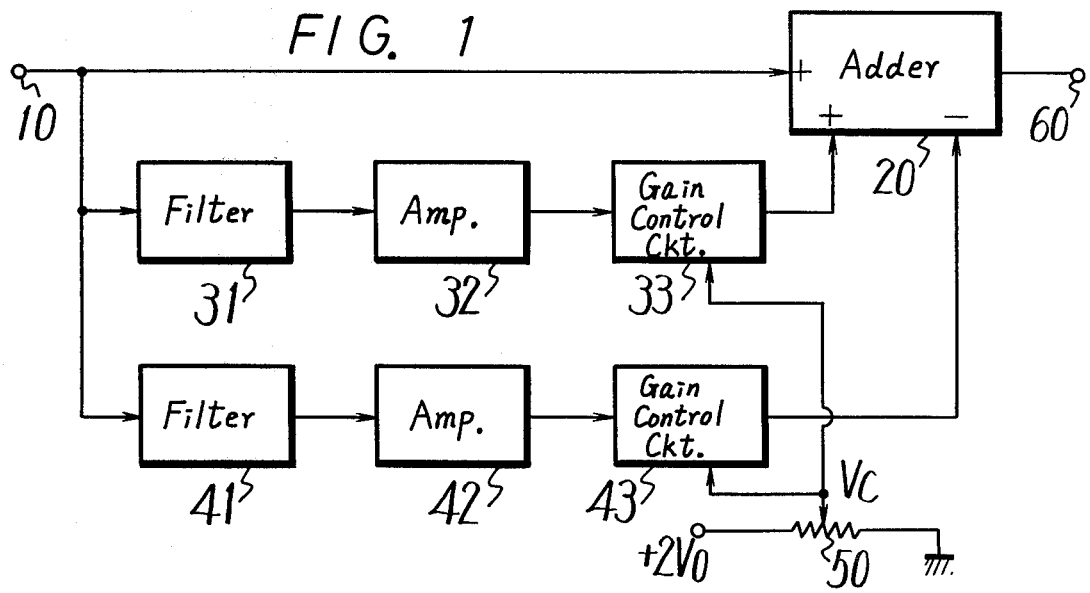
FIG. 1 is a systematic diagram of a tone control circuit for the explanation of this invention.
Figure 2:
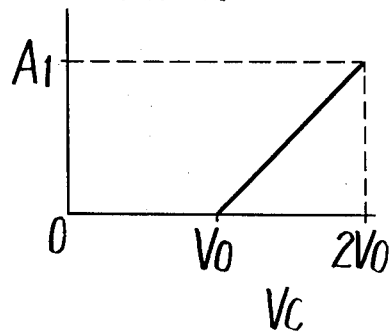
FIGS. 2 and 3 are graphs showing its characteristics.
Figure 3:
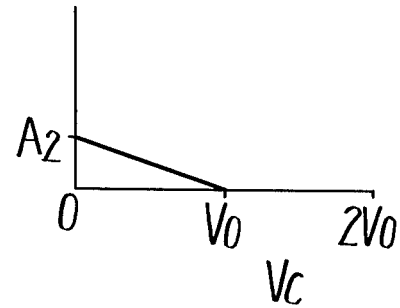
Figure 4:
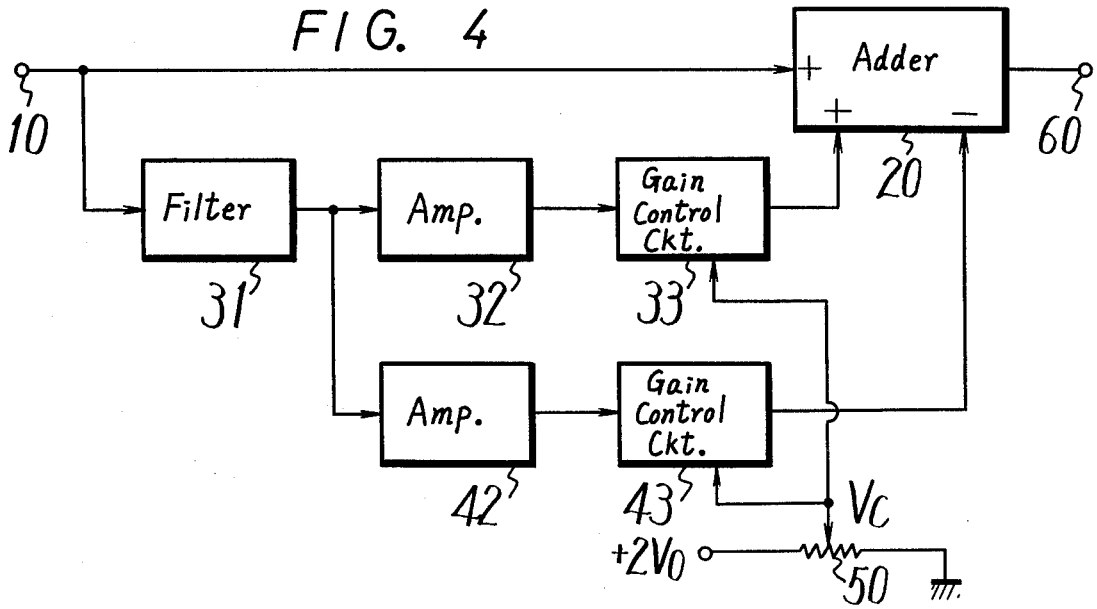
FIG. 4 is a systematic diagram of a tone control circuit used to explain this invention.
Figure 5:
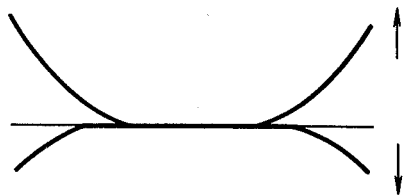
FIG. 5 is a graph showing the characteristic thereof.
Figure 6:
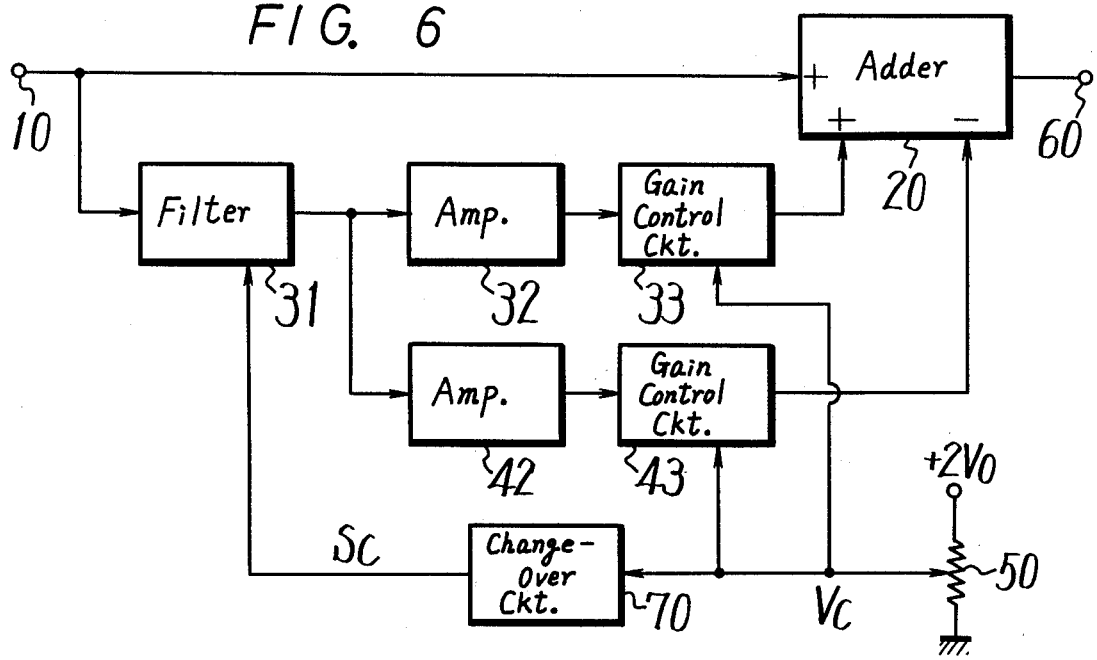
FIG. 6 is a systematic diagram showing an example of the tone control circuit according to this invention.

FIG. 6 shows an example of the tone control circuit according to this invention, in which the control voltage $V_C$ from the volume 50 is fed to a change-over circuit 70 to provide a change-over signals $S_C$ which have different states for the boost mode and the cut mode. When the voltage $V_C$ is higher than the center value $V_O$ as set forth above, the circuit is in the boost mode, while when the voltage $V_C$ is lower than the center value $V_O$, the circuit is in the cut mode. Therefore, the change over circuit 70 is constructed such that it compares the control voltage $V_C$ with the reference voltage $V_O$. The change-over signal $S_c$ is supplied to the filter 31 to change the time constant of the filter 31 between the boost and cut times. As will be apparent from FIG. 5, in the case of the treble it is sufficient that the time constant in the boost mode be selected to be smaller than that in the cut mode, while in the case of the base it is sufficient that the time constant in the boost mode be selected to be larger than that in the cut mode.

According to the tone control circuit of this invention, as is shown in FIG. 5 the characteristics in the boost and cut modes become such that the cut-off frequency is equivalently shifted, and hence the characteristics become favourable for auditory response.

Figure 7:
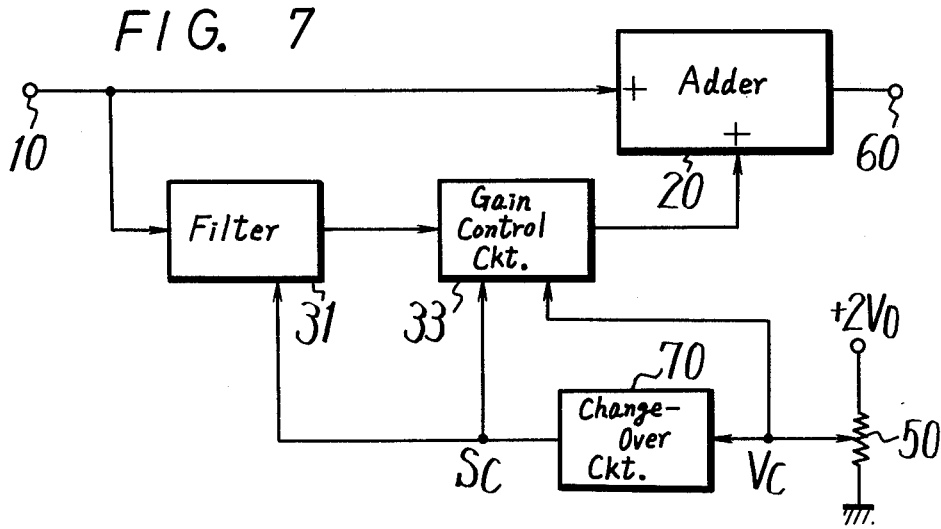
FIG. 7 is systematic diagram illustrating another example of the tone control circuit according to this invention.

FIG. 7 shows another example of this invention. In this example, it may be possible that the gain control circuit 33 is used in common to the boost and cut modes and serves as the amplifier and is changed over by the change-over signal $S_C$ in both boost and cut modes.

That is, in the case of the treble control in the boost mode, the gain of the circuit 33 becomes $A_1$ which is the gain of the above amplifier 32, while in the cut mode the gain of the circuit 33 becomes $A_2$ which is the gain of the above amplifier 42 and also the output becomes opposite in polarity. Since this change-over is carried out when the control voltage $V_C$ is near the center value $V_O$ and the input signal itself is dominant, sharp variations are not caused.

Figure 8:
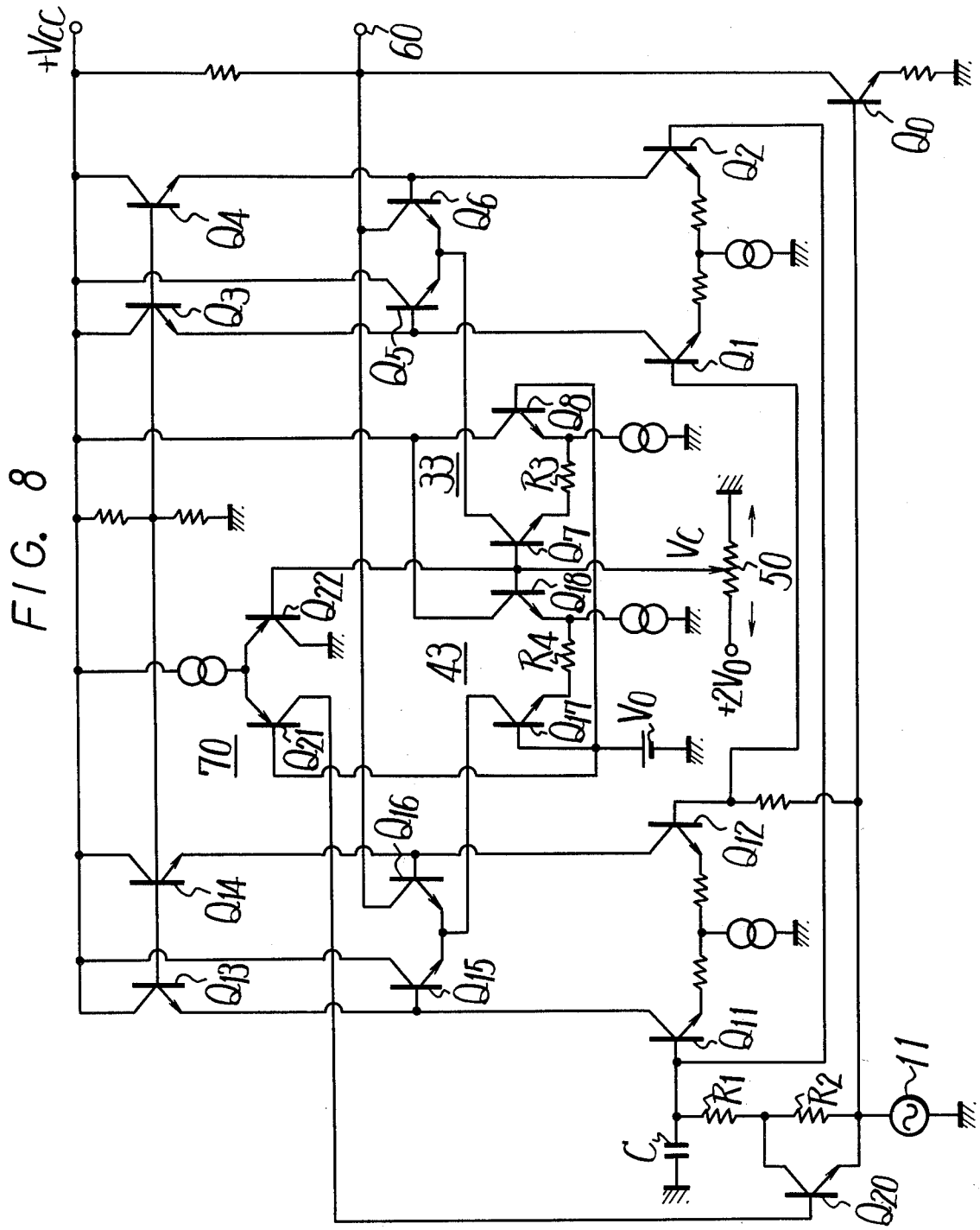
FIG. 8 is a connection diagram depicting an example of the tone control circuit according to this invention.

FIG. 8 shows a practical example of this invention and corresponds to the case of the treble control. An input signal from a signal source 11 is supplied, to a transistor $Q_0$. The block for the high boost is formed of transistors $Q_1$ to $Q_8$, while the block for the high cut is formed of transistors $Q_{11}$ to $Q_{18}$. The change-over circuit 70 is constructed of transistors $Q_{21}$ and $Q_{22}$.

In the high boost mode where the control voltage $V_C$ is larger than the center value $V_O$, the transistor $Q_{21}$ is made ON but the transistor $Q_{22}$ is made OFF. Thus, the transistor $Q_{20}$ becomes ON so that a filter having a small time constant is formed by a capacitor C and a resistor $R_1$. At this time, the transistors $Q_7$ and $Q_{18}$ are in ON-state and transistors $Q_8$ and $Q_{17}$ are in OFF-state, so that a current flows through the transistor $Q_6$ but no current flows through the transistor $Q_{16}$. And, while the input signal from the signal source 11 is applied unmodified to the base of the transistor $Q_1$, this input signal is supplied to the base of the transistor $Q_2$ through the low pass filter consisting of the capacitor C and resistor $R_1$. Thus, the signal low frequency components are cancelled and the signal high frequency components flow to the transistors $Q_1$ and $Q_2$. The signal currents are derived through the transistor $Q_6$ and the high frequency components are added. In this case, the gain is determined by a resistor $R_3$ at the emitter side of the transistor $Q_7$.

While, in the high cut mode where the control voltage $V_C$ is lower than the center value $V_O$, the transistor $Q_{21}$ is in the OFF-state and the transistor $Q_{22}$ is in the ON-state. Then transistor $Q_{20}$ turns OFF so that a filter having a large time constant is formed by the capacitor C and resistors $R_1$ and $R_2$. At this time, the transistors $Q_8$ and $Q_{17}$ are turned ON and the transistors $Q_7$ and $Q_{18}$ are turned OFF so that the current flows through the transistor $Q_{16}$ but no current flows through the transistor $Q_6$. The input signal from the signal source 11 is fed, unmodified, to the base of the transistor $Q_{12}$ and the same signal is supplied through the low pass filter which is formed of the capacitor C and resistors $R_1$ and $R_2$ to the base of the transistor $Q_{11}$. Therefore, the high frequency signal components flow to the transistors $Q_{12}$ and $Q_{11}$. The signal current is then derived through the transistor $Q_{16}$ and the high frequency components are subtracted. In this case, the gain is determined by a resistor $R_4$ at the emitter side of the transistor $Q_{17}$.

The function of the transistor $Q_0$ is inverting and the transistors $Q_3$, $Q_4$, $Q_{13}$ and $Q_{14}$ are loads.

The addition and subtraction are performed as follows:

In the case of high boost mode, the low frequency signal which has passed through the low pass filter comprising $R_1$, $R_2$, C and $Q_{20}$ is provided to $Q_2$ while the input signal itself having both high and low frequency component is provided to $Q_1$. Then, due to the characteristic of the differential amplifier, the frequency components supplied to $Q_1$ and $Q_2$ are cancelled and the high frequency signal having the same phase as the input signal appears at the collector of $Q_2$. Then, this high frequency signal is inverted by $Q_6$ and has the same phase as the input signal inverted by $Q_0$. That is, the high frequency component is added to the input signal at point 60. This is how the addition is performed.

On the other hand, in the case of the high cut mode, the low frequency component is also cancelled by the differential amplifier of $Q_{11}$ and $Q_{12}$ in the same manner as above, and the inverted high frequency component appears at the collector of $Q_{12}$. Then, this signal is inverted by $Q_{16}$ and has the reverse phase of the input signal inverted by $Q_0$. Accordingly, high frequency component is subtracted from the input signal at the point of 60. This is how the subtraction is performed.

The basic circuit of the gain control amplifier shown in FIG. 8 is well-known in the art. For example, a similar circuit is shown in U.S. Pat. No. 3,676,789.

We claim:

1. A tone control circuit having a first signal path passing an input signal directly and a second signal path having at least a filter and a gain control circuit, comprising:

(a) calculating means for adding a signal from said first signal path to a signal from said second signal path to form an output signal;

(b) control means for providing a control voltage for said gain control circuit; and
(c) switching means for determining a frequency mode of said output signal from said control voltage and changing the frequency characteristic of said second signal path in accordance with said frequency mode.

2. A tone control circuit according to claim 1 wherein the frequency characteristic of said filter is switched in accordance with said frequency mode.

3. A tone control circuit according to claim 1 wherein the frequency characteristic of said gain control circuit is switched in accordance with said frequency mode.

4. A tone control circuit according to claim 1 wherein said control voltage is a DC voltage.

5. A tone control circuit according to claim 2 wherein the time constant of said filter is switched in accordance with said frequency mode.

6. A tone control circuit according to claim 1 wherein said frequency mode is a boost or a cut of a certain frequency band.

* * * * *